United States Patent
Interrante et al.

(10) Patent No.: US 10,804,181 B2
(45) Date of Patent: Oct. 13, 2020

(54) HETEROGENEOUS THERMAL INTERFACE MATERIAL FOR CORNER AND OR EDGE DEGRADATION MITIGATION

(71) Applicant: International Business Machines Corporation, Armonk, NY (US)

(72) Inventors: Marcus E. Interrante, Highland, NY (US); Sushumna Iruvanti, Wappingers Falls, NY (US); Shidong Li, Hopewell Junction, NY (US); Tuhin Sinha, Oradell, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/299,410

(22) Filed: Mar. 12, 2019

(65) Prior Publication Data

US 2020/0294880 A1   Sep. 17, 2020

(51) Int. Cl.
| | |
|---|---|
| *H01L 23/373* | (2006.01) |
| *H01L 23/367* | (2006.01) |
| *H01L 23/00* | (2006.01) |
| *H01L 21/48* | (2006.01) |
| *H01L 23/31* | (2006.01) |

(52) U.S. Cl.
CPC ...... *H01L 23/3733* (2013.01); *H01L 21/4882* (2013.01); *H01L 23/3185* (2013.01); *H01L 23/3672* (2013.01); *H01L 23/3675* (2013.01); *H01L 24/16* (2013.01); *H01L 2224/16225* (2013.01)

(58) Field of Classification Search
CPC ............ H01L 23/3733; H01L 23/3185; H01L 23/3672; H01L 23/3675; H01L 21/4882; H01L 24/16; H01L 2224/16225
USPC ........................................................ 257/717
See application file for complete search history.

(56) References Cited

U.S. PATENT DOCUMENTS

| | | |
|---|---|---|
| 7,014,093 B2 | 3/2006 | Houle et al. |
| 7,312,261 B2 | 12/2007 | Sachdev et al. |
| 7,384,821 B2 | 6/2008 | Sung |
| 7,838,985 B2 | 11/2010 | Chiang et al. |
| 7,996,989 B2 | 8/2011 | Dani et al. |
| 8,582,297 B2 | 11/2013 | Edwards et al. |
| 8,810,028 B1 | 8/2014 | Zohni et al. |
| 9,041,192 B2 | 5/2015 | Saeidi et al. |
| 9,287,233 B2 * | 3/2016 | Chen ............... H01L 24/17 |
| 2016/0155682 A1 | 6/2016 | Ahuja et al. |
| 2016/0262253 A1 | 9/2016 | Isaacs et al. |

* cited by examiner

*Primary Examiner* — Tu-Tu V Ho
(74) *Attorney, Agent, or Firm* — ZIP Group PLLC

(57) ABSTRACT

Embodiments of the present invention relate to an heterogenous thermal interface material (TIM). The heterogenous TIM includes two or more different materials. One material has a low elastic modulus, also known as Young's modulus, and is utilized primarily to transfer heat from one component to another component. Another material has a higher elastic modulus and is primarily utilized to bond or connect the corners and/or edges of one component to the other component. The high elastic modulus material is generally located within the heterogenous TIM where TIM strain is or is expected to be high. For example, the high elastic modulus material may be located at the corner and/or edge regions of the heterogenous TIM.

7 Claims, 10 Drawing Sheets

HETEROGENEOUS THERMAL INTERFACE MATERIAL FOR CORNER AND OR EDGE DEGRADATION MITIGATION

FIELD OF THE EMBODIMENTS

Embodiments of the present invention generally relate to electronic devices or systems, such as an electronic package, that include a heterogenous thermal interface material (TIM) that includes two or more different materials. One material has a low elastic modulus and is utilized primarily to transfer heat from one component to/from another component. Another material has a higher elastic modulus and is primarily utilized to bond or connect the corner(s) and/or edge(s) of one component to the other component.

DESCRIPTION OF THE RELATED ART

Some electronic packages include a processor or other data handling component that generates heat. A cover, lid, or other heat spreader may be utilized to assist with dissipating the generated heat. A TIM may be utilized to both bond or connect the heat generating component and the heat dissipating component and to aid in the transfer of heat from the heat generating component to the heat dissipating component. In some instances, in accelerated lab testing to project long, field use conditions, a rise in temperature is observed along the edges and corners of the heat generating device. This increase in temperature, or an increase in thermal resistance, indicates a degradation in heat transfer between the interface surfaces of the higher temperature component and the lower temperature component, respectively.

In the case of more than one heat generating device placed adjacent to another on a carrier, such as multi-chip module, or the like, the TIM strain along the inner corners and edges of the multiple heat generating devices is projected to be high, resulting in increased thermal resistance and thermal degradation. Such a thermal resistance increase may result in the heat generating device(s) temperature rise or result in local hot spots causing a deterioration of the generating device functionality or its reliability.

Prior attempts to address corner or edge TIM thermal degradation have involved controlling the flatness of these interface surfaces, in order to minimize the TIM being stretched beyond its elastic limit and in order to minizine the TIM losing adequate contact therewith. Warp control has involved adding stiffeners, lid ties, and the like, to the electronic package to effectively flatten these interface surfaces. Such solutions add to complexities to the fabrication of the electronic package, negatively affecting the yield thereof.

SUMMARY

In an embodiment, an integrated circuit (IC) chip carrier package is presented. The IC chip carrier package includes a carrier comprising an IC chip connected thereto. The IC chip carrier package further includes a lid connected to the carrier and connected to an upper surface of the IC chip by a heterogenous thermal interface material (TIM). The heterogenous TIM includes one or more high modulus TIM instances and a low modulus TIM. The one or more high modulus TIM instances are each between and join the upper surface of the IC chip and the lid. Each high modulus TIM instance is located nearest to a different corner of the IC chip. The low modulus TIM is between and joins the upper surface of the IC chip and the lid. The low modulus TIM is located upon remaining area of the upper surface of the IC chip and adjacently contacts each high modulus TIM instance.

In another embodiment, an electronic device is presented. The electronic device includes a heatsink or a cold plate connected to an integrated circuit (IC) chip package by a heterogenous thermal interface material (TIM). The IC chip package includes a carrier comprising an IC chip connected thereto. The IC chip package also includes a lid connected to the carrier and thermally connected to an upper surface of the IC chip. The heterogenous TIM includes one or more high modulus TIM instances and a low modulus TIM. Each one or more high modulus TIM instances is between and joins the upper surface of the lid and the heatsink or cold plate and is located nearest to a different corner of the lid. The low modulus TIM is between and joins the upper surface of the lid and the heatsink or cold plate. The low modulus TIM is located upon remaining area of the upper surface of the lid and adjacently contacts each high modulus TIM instance.

In yet another embodiment, a method to thermally connect components with a heterogenous thermal interface material (TIM) is presented. The method includes forming a plurality of high modulus TIM instances upon a TIM interface surface of a first component. The method further includes forming a low modulus TIM upon the TIM interface surface. The method further includes simultaneously curing the plurality of high modulus TIM instances and the low modulus TIM. The plurality of high modulus TIM instances are between and join the TIM interface surface of the first component and a TIM interface surface of a second component. Each high modulus TIM instance is located nearest to a different corner of the first component. The low modulus TIM is between and joins the TIM interface surface of the first component and the TIM interface surface of the second component. The low modulus TIM is located upon remaining area of the TIM interface surface of the first component and adjacently contacts each high modulus TIM instance.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention relate to an heterogenous thermal interface material (TIM). The heterogenous TIM includes two or more different materials. One material has a low elastic modulus, also known as Young's modulus. Another material has a higher elastic modulus. The higher elastic modulus material may be located at one or more edges and each corner of the heterogenous TIM. Providing the heterogenous TIM of different moduli materials may be beneficial to account for increased TIM strain in some locations and mitigate the corresponding thermal resistance increase or thermal degradation.

Figure 1:
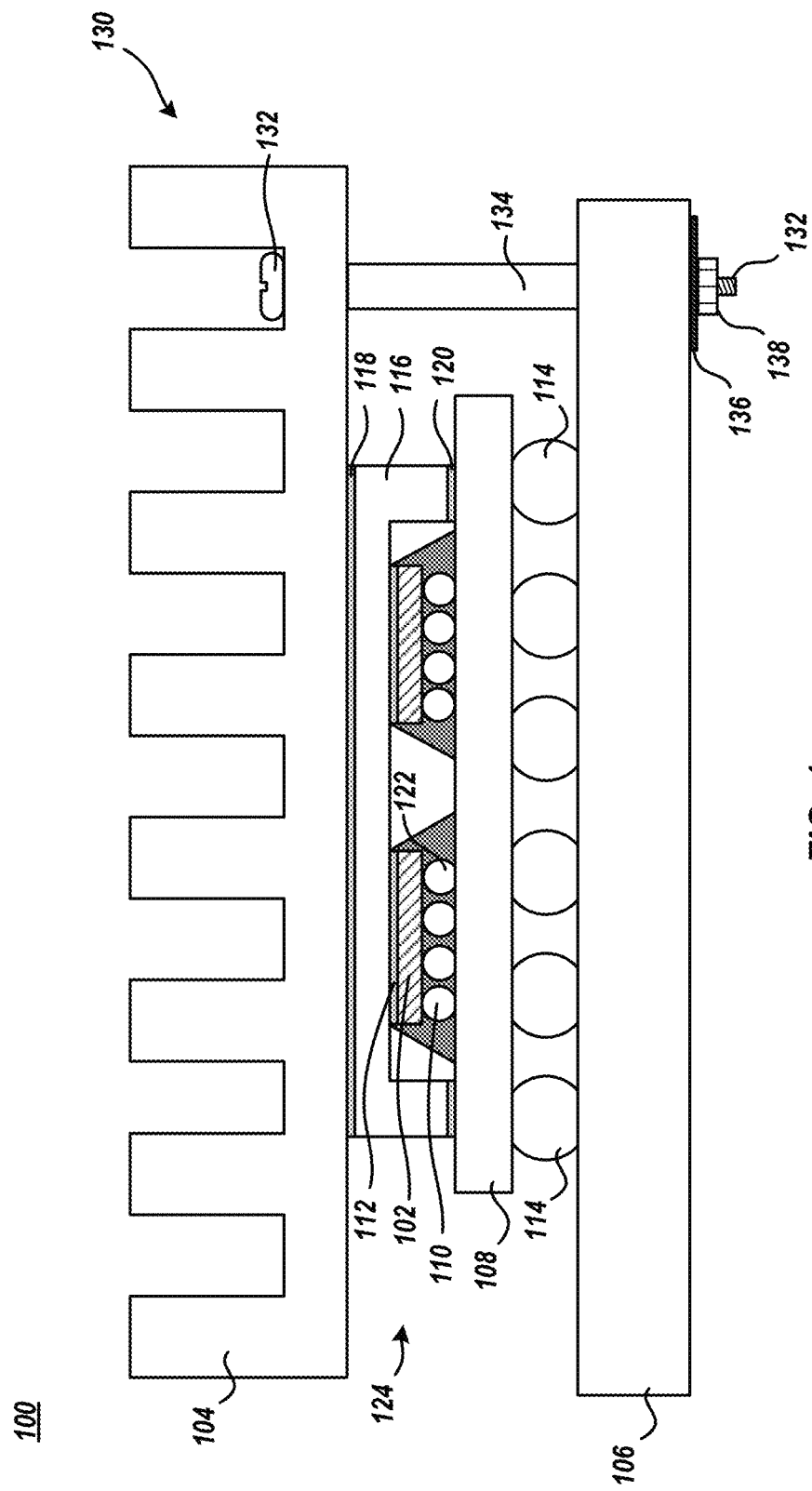
FIG. 1 depicts a cross section of a prior art electronic system.

FIG. 1 depicts a prior art electronic system 100 that includes an IC carrier package 124. Electronic system 100 may be for example a computer, server, mobile device, tablet, and the like. Package 124 includes one or more chips 102, carrier 108, interconnects 122, one or more underfill 110 instances, one or more thermal interface material 112 instances, lid 116, and adhesive 120. Chip 102 may be an IC chip, semiconductor die, processor, microchip, field programmable gate array, or the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may electrically isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108, a lid 116 is attached to carrier 108 with adhesive 120 to cover chip 102. Generally, during operation of electronic system 100, heat is removed from chip 102. In this situation, lid 116 is both a cover and a conduit for heat transfer. As such, a thermal interface material 112 may thermally join lid 116 and chip 102.

Package 124 may be connected to a motherboard 106 via interconnects 114. Motherboard 106 may be the main printed circuit board of electronic system 100 and includes electronic components, such as a graphics processing unit, memory, and the like, and provides connectors for other peripherals. Interconnects 114 electrically connect the lower side of carrier 108 to motherboard 106 and may be a wire bond, solder bond, stud, conductive ball, conductive button, and the like. Interconnects 114 may be larger and thus more robust than interconnects 122. When package 124 is seated upon motherboard 106 a second reflow process may be performed to join interconnects 114 to electrical contacts of both carrier 108 and motherboard 106. Alternately, a mechanical pressurized interconnect via an intervening socket may be established.

To assist in the removal of heat from chip 102, a heatsink or cold plate 104, which may be referred simply as heatsink 104, may be thermally joined to package 124 via thermal interface material 118. Heatsink 104 cools chip 102 by dissipating heat into the surrounding air or the circulating water. As such, during operation of electronic system 100, a substantially vertical thermal path (i.e. most common direction of heat transfer is parallel to the y axis) exists through chip 102 to heatsink 104 through thermal interface material 112, lid 116, and thermal interface material 118, and the like. Heatsink 104 may be connected to motherboard 106 via one or more connection device 130. Connection device 130 may include a threaded fastener 132, standoff 134, backside stiffener 136, and fastener 138. Threaded fastener 132 may extend through heatsink 104, standoff 134, and backside stiffener 136 and provides compressive force between heatsink 104 and backside stiffener 136. The length of standoff 134 may be selected to limit the pressure exerted upon package 124 by heatsink 104 created by the compressive forces. Backside stiffener 136 may mechanically support the compressive forces by distributing the forces across a larger area of motherboard 106. In other applications, connection device 130 may be a clamp, non-influencing fastener, cam, and the like, system that adequately forces heatsink 104 upon package 124.

FIG. 2A, FIG. 2B, FIG. 3A, FIG. 3B, FIG. 4A, and FIG. 4B depict normal views of heterogenous TIM 200 instances.

Figure 12:
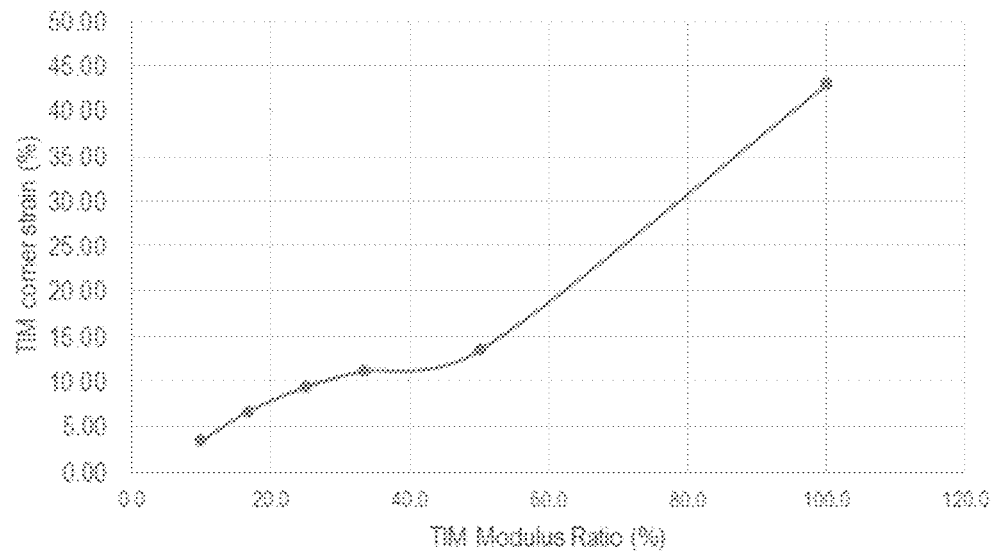
FIG. 12 depicts a graph of variation of TIM corner strain versus TIM modulus ratio, according to tone or more embodiments of the present invention.

Heterogenous TIM 200 includes a low modulus TIM 210 and a high modulus TIM 220. Low modulus TIM 210 is a thermal interface material that, when cured, has a low elastic modulus. The modulus may be in the range of 0.1 to 5 MegaPascals (MPa). Preferably in the 0.5 to 1 MPa. Higher modulus TIM 220 is a thermal interface material that, when cured, has an elastic modulus at least twice that of TIM 210. High modulus TIM 220 may have a modulus in the range of 5-100 MPa. Preferably in the range of 5-50 MPa. Or more preferably in the 5-10 MPa. As such, high modulus TIM 220 is more amenable to being deformed elastically relative to low modulus TIM 210 and better accommodates TIM strain at the corner and edge regions. Low modulus TIM 210 and high modulus TIM 220 consist of or otherwise include polymers that when cured result in hardening of the TIM due to polymer cross-linking. In some cases, as is indicated for example in FIG. 12, the TIM corner strain is projected to be lowered when the modulus of the low modulus TIM 210 is about 10%-30% of the higher modulus TIM 220.

Low modulus TIM 210 may be, for example, a weakly cross-linked polymer compound, or the like. High modulus TIM 220 may be, for example, an adhesive, or the like. In some instances, low modulus TIM 210 has a higher thermal conductivity relative to the thermal conductivity of high modulus TIM 220.

High modulus TIM 220 is positioned relative to low modulus TIM 210 such that high modulus TIM 220 instance(s) are located at the corners and/or edges of heterogenous TIM 200.

Figure 2A:
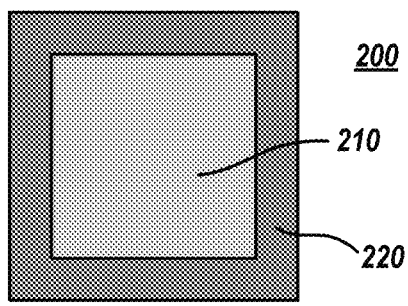
FIG. 2A and FIG. 2B depict a normal view of a heterogenous TIM, according to one or more embodiments of the present invention.
Figure 2B:
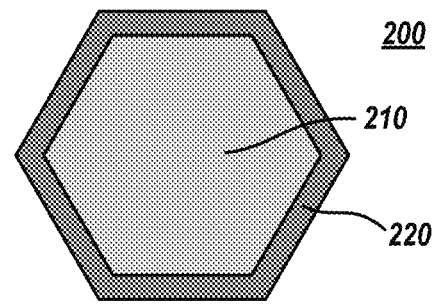

For example, as shown in FIG. 2A and FIG. 2B, high modulus TIM 220 is positioned exterior to low modulus TIM 210. That is, low modulus TIM 210 may be positioned entirely inside of the high modulus TIM 220 such that high modulus TIM 220 forms a perimeter of the heterogenous TIM 200. In such embodiments, high modulus TIM 220 forms or is generally nearer to each edge or side surface of the heterogenous TIM 200 relative to the low modulus TIM.

Figure 3A:
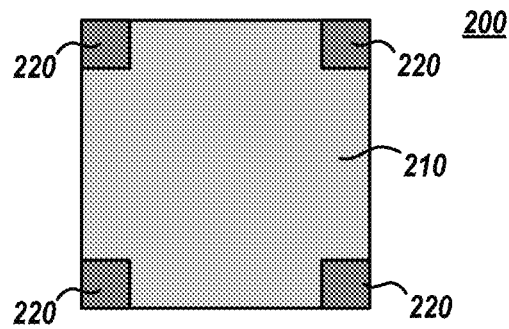
FIG. 3A and FIG. 3B depict a normal view of a heterogenous TIM, according to one or more embodiments of the present invention.
Figure 3B:
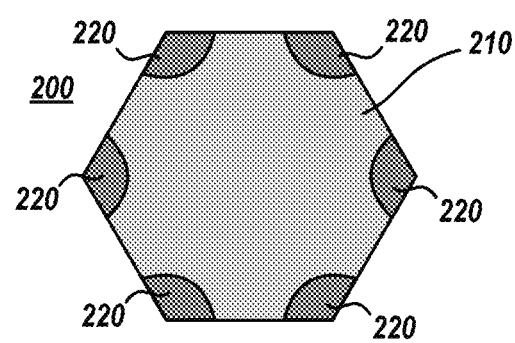

For example, as shown in FIG. 3A and FIG. 3B, a high modulus TIM 220 instance forms or is generally nearer to a corner of the heterogenous TIM 200 relative to the low modulus TIM 210. The term corner as utilized herein is defined to be the intersection of two non-planar edge or side surfaces of a reference element.

Figure 4A:
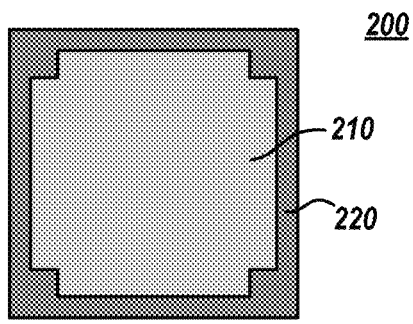
FIG. 4A and FIG. 4B depict a normal view of a heterogenous TIM, according to one or more embodiments of the present invention.
Figure 4B:
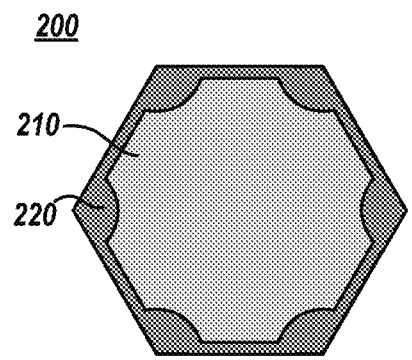

For example, as shown in FIG. 4A and FIG. 4B, high modulus TIM 220 edge portions are positioned exterior to low modulus TIM 210 and high modulus TIM 220 corner portions are positioned at each corner of heterogenous TIM 200. In such embodiments, low modulus TIM 210 is positioned entirely inside of the high modulus TIM 220 such that high modulus TIM 220 edge portions form a perimeter of the heterogenous TIM 200 and the high modulus TIM 220 portions form or are generally nearest to each corner of the heterogenous TIM 200 relative to the low modulus TIM 210.

Though shown having two different normal view shapes in the Figures, heterogenous TIM 200 may take the normal view shape of the reference component TIM interface surface, as is further described herein. As such, heterogenous TIM 200 may have a different normal view shape than those shown in the Figures.

Figure 5:
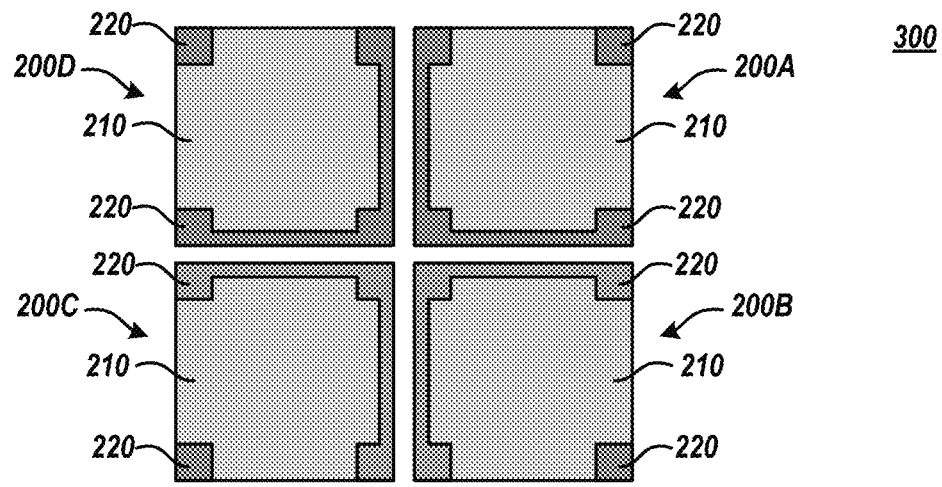
FIG. 5 depicts a normal view of multiple heterogenous TIM instances, according to one or more embodiments of the present invention.

FIG. 5 depicts a normal view of multiple heterogenous TIM instances 200A, 200B, 200C, and 200D. In the present example, each heterogenous TIM instance 200A, 200B, 200C, and 200D has one or more high modulus TIM 220 edge portions that form at least a local perimeter of the respective heterogenous TIM instance (e.g., a two sided perimeter of the heterogenous TIM instance, as is shown) and has high modulus TIM 220 corner portions positioned at each corner of heterogenous TIM 200. High modulus TIM 220 edge portions may be positioned such that they face a neighboring heterogenous TIM instance. For example, high modulus TIM 220 edge portions of heterogenous TIM instances 200A may face heterogenous TIM instances 200B, 200D, respectively.

Figure 6:
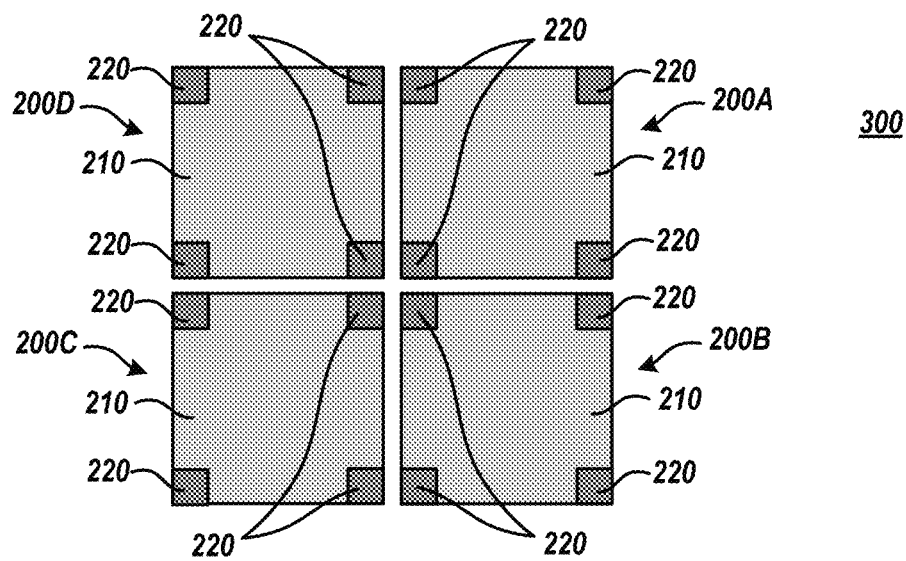
FIG. 6 depicts a normal view of multiple heterogenous TIM instances, according to one or more embodiments of the present invention.

FIG. 6 depicts a normal view of multiple heterogenous TIM instances 200A, 200B, 200C, and 200D. In the present example, each heterogenous TIM instance 200A, 200B, 200C, and 200D have high modulus TIM 220 instances at each corner of each respective heterogenous TIM 200 instance. Each high modulus TIM 220 instance forms or is generally nearer to a respective corner of its associated heterogenous TIM 200 instance, relative to the associated low modulus TIM 210.

Figure 7:
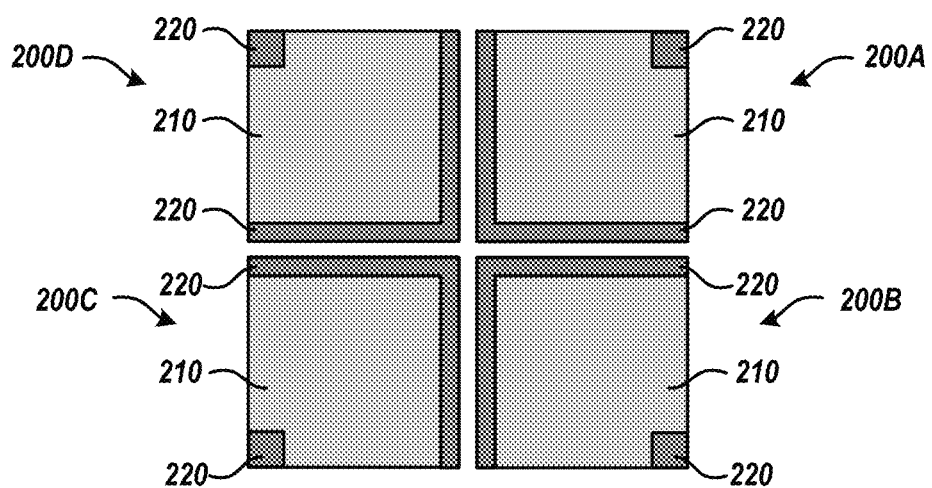
FIG. 7 depicts a normal view of multiple heterogenous TIM instances, according to one or more embodiments of the present invention.

FIG. 7 depicts a normal view of multiple heterogenous TIM instances 200A, 200B, 200C, and 200D. In the present example, each heterogenous TIM instance 200A, 200B, 200C, and 200D has one or more high modulus TIM 220 edge portions that form at least a local perimeter of the respective heterogenous TIM instance (e.g., a two sided perimeter of the heterogenous TIM instance, as is shown) and has a high modulus TIM 220 corner portion positioned at one or more corners of heterogenous TIM 200. High modulus TIM 220 edge portions may be positioned such that they face a neighboring heterogenous TIM 200 instance. For example, high modulus TIM 220 edge portions of heterogenous TIM instances 200A may face heterogenous TIM instances 200B, 200D, respectively.

Figure 8:
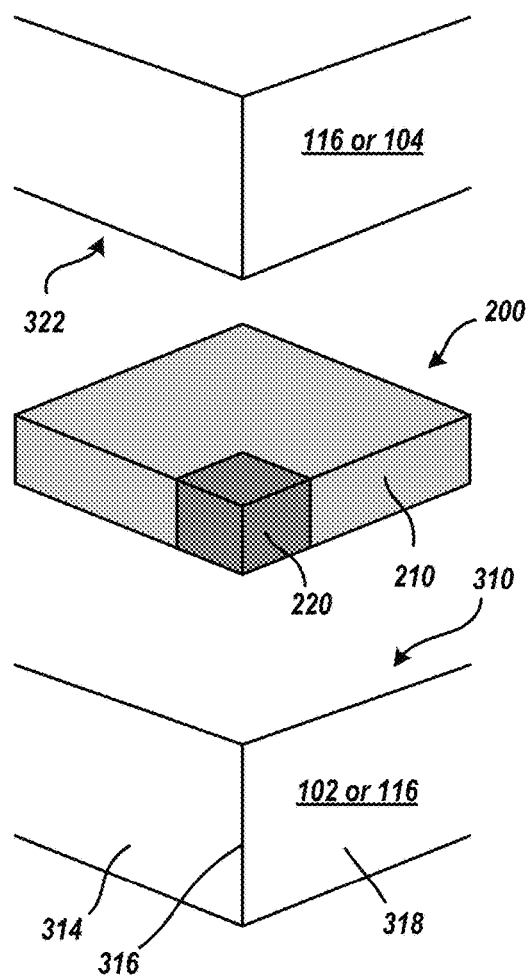
FIG. 8 depicts an isometric exploded view of a heterogenous TIM between a higher temperature component and a lower temperature component, according to one or more embodiments of the present invention.
Figure 9:
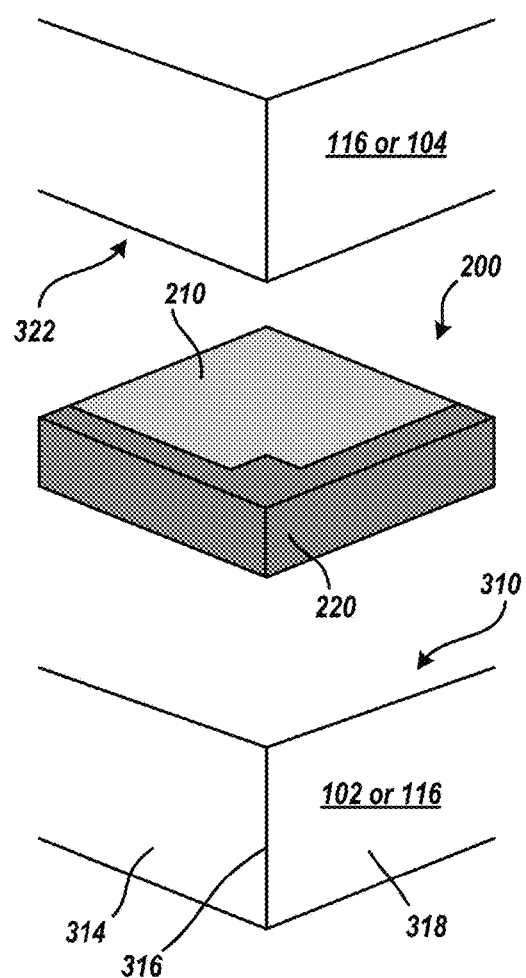
FIG. 9 depicts an isometric exploded view of a heterogenous TIM between a higher temperature component and a lower temperature component, according to one or more embodiments of the present invention.

FIG. 8 and FIG. 9 depict an isometric exploded view of a heterogenous TIM 200 between a higher temperature component and a lower temperature component. In some instances, the higher temperature component may be below heterogenous TIM 200. For example, the heterogenous TIM 200 may be above or upon TIM interface surface 310 and/or may be upon or below TIM interface surface 322. In these instances, the lower temperature component may be above the heterogenous TIM 200.

Heterogenous TIM 200 may be fabricated by depositing or otherwise forming a bead or other pattern, shown for example, in FIG. 13-FIG. 16, of uncured low modulus TIM 210 upon TIM interface surface 310 and/or upon TIM interface surface 322. For example, a star pattern, circle pattern, or the like, as is known, of uncured low modulus TIM 210 may be formed upon the upper surface of IC chip 102 and/or upon the lower surface of lid 116. Heterogenous TIM 200 may be further fabricated by depositing or otherwise forming a bead or other pattern, shown for example, in FIG. 13-FIG. 16, of uncured high modulus TIM 220 upon TIM interface surface 310 and/or upon TIM interface surface 322. For example, a dot, circle pattern, or the like, as is known, of uncured high modulus TIM 220 may be formed upon the upper surface of IC chip 102 and/or upon the lower surface of lid 116.

The uncured low modulus TIM 210 and uncured high modulus TIM 220 are deposited relative to each other such that high modulus TIM 220 instances, when cured, form the corners and/or edges of heterogenous TIM 200 and the low modulus TIM 210 generally cover the remaining area of the TIM interface surface 310. For example, as shown in FIG. 8, the uncured high modulus TIM 220 is positioned relative to the uncured low modulus TIM 210 such that when the high modulus TIM 220 and the low modulus TIM 210 are cured, the high modulus TIM 220 is nearest to corner 316 relative to any of the low modulus TIM 210. Edge surface 314 is generally not planar with edge surface 318. For example, as shown in FIG. 9, the uncured high modulus TIM 220 is positioned relative to the uncured low modulus TIM 210 such that when the high modulus TIM 220 and the low modulus TIM 210 are cured, the high modulus TIM 220 is nearest to corner 316, nearest to edge surface 314, and nearest to edge surface 318, relative to any of the low modulus TIM 210. Corner 316 and two edge surfaces 314, 318 may be representative of each corner and/or edge surface of IC chip 102 or lid 116.

TIM interface surface 310 may be the upper surface or top of IC chip 102 while TIM interface surface 322 may be the lower surface or underside of lid 116. In such instance and when in operation, the IC chip 102 is typically the higher temperature component relative to lid 116. As such, heat from the IC chip 102 flows into the lid 116. Alternatively, TIM interface surface 310 may be the upper surface or top of lid 116 while TIM interface surface 322 may be the lower surface or underside of heatsink 104. In such instance and when IC chip 102 is in operation, the lid 116 is typically the higher temperature component relative to heat sink 104. As such, heat from the lid 116 flows into heat sink 104. Therefore, edge surface 314 and edge surface 318 may be non-planar side surfaces of IC chip 102 or non-planar side surfaces of lid 116, respectively, and corner 316 may a corner of IC chip 102 or corner of lid 116, respectively.

The ratio of low modulus TIM 210 vs. high modulus TIM 220 may be changed to achieve various design goals. For example, in some instances the amount of high modulus TIM 220 may be minimized to achieve adequate mechanical bonding of the areas of IC chip 102 or lid 116 nearest corner 316 and/or surfaces 314, 318 with TIM surface 322 and to maximize the heat transfer properties from TIM surface 310 to TIM surface 322 provided by low modulus TIM 210. Adequate mechanical bonding of the areas of IC chip 102 or lid 116 nearest corner 316 and/or surfaces 314, 318 with TIM surface 322 may be derived from the maximum theoretical heterogenous TIM 200 strain, Chip-package interaction (CPI) stress, or the like. In this manner, the strain exhibited upon the e.g., corners of IC chip 102 by elastic variations or dimensional changes of the electronic package may be reduced by the increased mechanical bonding of IC chip 102 to lid 116 provided by high modulus TIM 220.

Generally, providing heterogenous TIM 200 of different moduli materials 210, 220 may be beneficial to account for increased TIM strain in some locations (i.e. corners and/or edges) and mitigate the corresponding thermal resistance increase or thermal degradation. Utilization of heterogenous TIM 200 may result in the positive outcome of minimizing thermal resistance increases or thermal degradation at the edges and corners of the heat generating device, IC chip, or the like. Whereas, if a single homogeneous TIM is utilized, a gradual increase in thermal resistance along the IC chip perimeter as a function of stress duration may be seen. This may result in the device temperature increase or hot spots, resulting in a deterioration of the device functionality or its reliability. Such thermal resistance increase, or degradation may be mitigated and/or arrested with the utilization of heterogeneous TIM 200.

In some embodiments, as shown in FIG. 9, the top surface of low modulus TIM 210 may be coplanar with the top surface of high modulus TIM 220 and when in operation may be coplanar with TIM surface 322. Similarly, the bottom surface of low modulus TIM 210 may be coplanar with the bottom surface of high modulus TIM 220 and when in operation may be coplanar with TIM surface 310. Respective side surfaces of high modulus TIM 220 may be coplanar with associated side surfaces of low modulus TIM 210 which may be coplanar with side edge surface 314 or side edge surface 318, respectively.

To effectively join or otherwise achieve an integral seam between high modulus TIM 220 and low modulus 210, gaps at the interface between high modulus TIM 220 and low modulus 210 may be minimized. In some implementations, high modulus TIM 220 and low modulus 210 may be chosen such that during simultaneous curing of high modulus TIM 220 and low modulus 210, polymers of high modulus TIM 220 may crosslink with polymers of low modulus 210.

Figure 10:
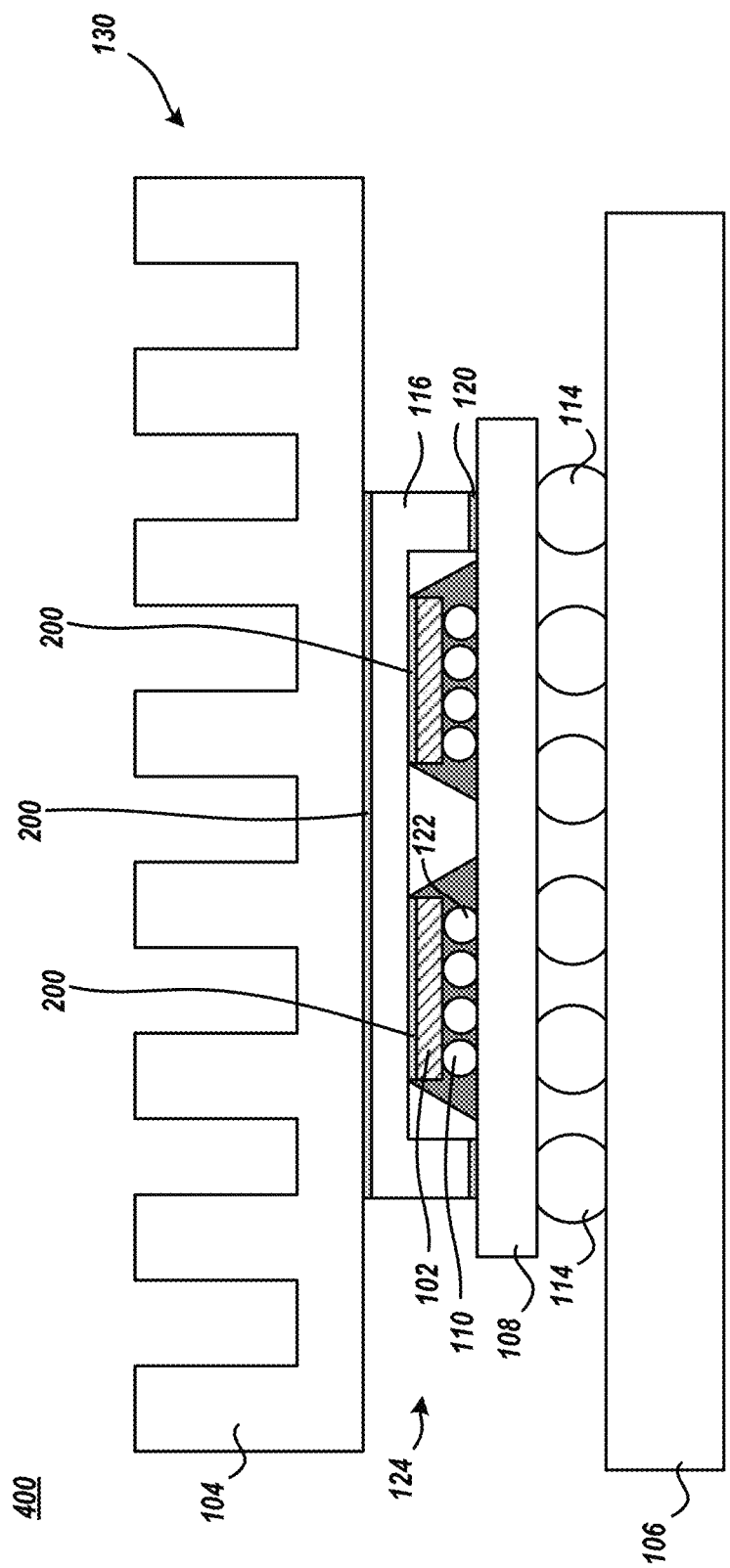
FIG. 10 depicts an electronic system that includes one or more heterogenous TIM instances, according to one or more embodiments of the present invention.

FIG. 10 depicts electronic system 400 that includes one or more heterogenous TIM 200 instances, according to one or more embodiments of the present invention. Electronic system 400 may be for example a computer, server, mobile device, tablet, cash machine, kiosk, and the like. Package 124 includes chip 102, carrier 200, interconnects 122, underfill 110, heterogenous TIM 200, lid 116, and adhesive 220. A heterogenous TIM 200 instance may be between each IC chip 102 and lid 116.

When chip 102 is seated upon carrier 200, a reflow process may be performed to join interconnects 222 to contacts of chip 102 with contacts of carrier 108. After chip 102 is seated to carrier 200, lid 116 may be attached to carrier 108 with adhesive 120 to cover each chip 102. Subsequently, low modulus TIM 210 and high modulus TIM 220 of each heterogenous TIM 200 instance may be simultaneously cured by e.g. heating package 124.

Generally, during operation of electronic system 400, heat is removed from each chip 102. In this situation, lid 116 is both a cover and a conduit for heat transfer. To further assist in the removal of heat from each chip 102, a heatsink 104 may be thermally joined to package 124 via a higher level heterogenous TIM 200 instance. Heatsink 104 may cool each chip 102 by dissipating heat into the surrounding air or into an actively circulating coolant. As such, during operation of electronic system 400, a substantially vertical thermal path exists through each chip 102 to heatsink 104 through each lower level heterogenous TIM 200 instance (each heterogenous TIM 200 instance that is between each chip 102 and lid 116), lid 116, and the higher level heterogenous TIM 200 instance (the heterogenous TIM 200 instance that is between the lid 116 and heat sink 104), and the like.

Figure 11:
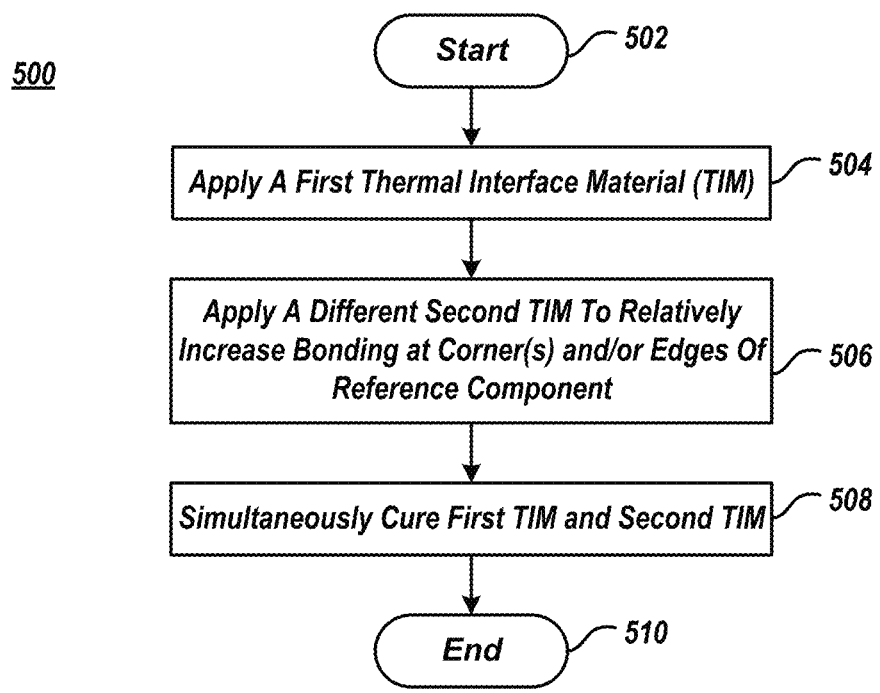
FIG. 11 depicts a fabrication method to thermally connect components with a heterogenous TIM, according to one or more embodiments of the present invention.

FIG. 11 depicts fabrication method 500 to thermally connect components with heterogenous TIM 200. Method 500 may be utilized, for example, in the fabrication of electronic package 124, or the like. Method 500 begins at block 502 and continues with applying a first TIM directly upon either TIM interface surface 310 and/or directly upon TIM interface surface 322 (block 504). For example, uncured low modulus TIM 210 is dispensed, deposited, or otherwise formed upon the upper surface of IC chip 102 and/or the underside surface of lid 116.

Method 500 may continue with applying a different second TIM directly upon either TIM interface surface 310 and/or directly upon TIM interface surface 322 such that different second TIM form the corners and/or one or more edges of the combined first TIM and second TIM combination (block 506). For example, uncured high modulus TIM 210 is dispensed, deposited, or otherwise formed upon the upper surface of IC chip 102 and/or the underside surface of lid 116 such that high modulus TIM 210 is positioned at the corners and/or one or more edges of the heterogeneous TIM 200. The uncured high modulus TIM 220 may be positioned relative to the uncured low modulus TIM 210 such that when the high modulus TIM 220 and the low modulus TIM 210 are cured, the high modulus TIM 220 is nearest to corner 316 relative to any of the low modulus TIM 210. Similarly, uncured high modulus TIM 220 may be positioned relative to the uncured low modulus TIM 210 such that when the high modulus TIM 220 and the low modulus TIM 210 are cured, the high modulus TIM 220 is nearest to corner 316, nearest to edge surface 314, and nearest to edge surface 318, relative to any of the low modulus TIM 210.

Method 500 may continue with positioning and connecting lid 116 upon carrier 108 via seal band 120 and with positioning and connecting lid 116 to one or more IC chips 102 such that the upper surface of each IC chip 102 is connected to lid 116 via the first TIM and the second TIM. For example, lid 116 is connected to carrier 108 by seal band 120 and is connected to each IC chip 102 by the local instance of heterogenous TIM 200 instance associated with each respective IC chip 102.

Method 500 may continue with simultaneously curing the first TIM and the second TIM (block 508). For example, the package 124 may be heated to cure simultaneously curing the first TIM and the second TIM. In some implementations, during curing, polymers in the first TIM crosslink with polymers in the second TIM along the interface of the first TIM and the second TIM. In other implementations, the first TIM abuts the second TIM at the interface of the first TIM and the second TIM such that gaps therebetween are minimized. Method 500 ends at block 510. In some embodiments, the high modulus TIM 220, the low modulus TIM 210, and seal band 120 are simultaneously cured.

Figure 13:
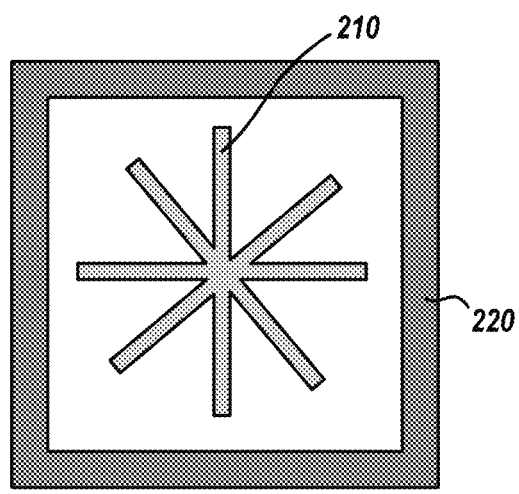
FIG. 13 through FIG. 16 depict exemplary deposition patterns of the materials of heterogenous TIM, according to one or more embodiments of the present invention.

FIG. 13 depicts an exemplary deposition pattern of high modulus TIM 220 and low modulus TIM 210. High modulus TIM 220 and low modulus TIM 210 may be deposited upon TIM interface surface 310 and/or upon TIM interface surface 322 in the exemplary pattern depicted. Under pressure between chip 102 and cover 116 or under pressure between cover 116 and heatsink 104, the depicted deposition pattern may result in the high modulus TIM 220 and low modulus TIM 210 being relatively positioned as shown for example in FIG. 2A.

Figure 14:
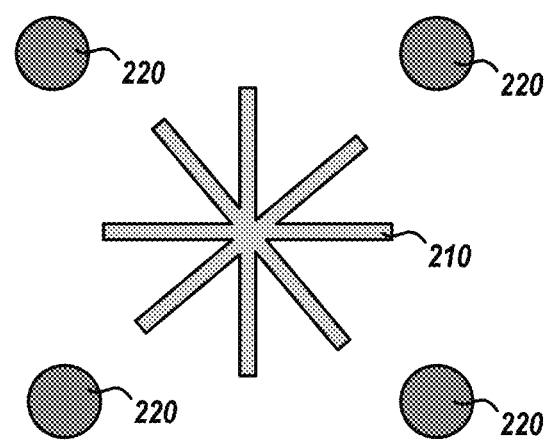

FIG. 14 depicts an exemplary deposition pattern of high modulus TIM 220 and low modulus TIM 210. High modulus TIM 220 and low modulus TIM 210 may be deposited upon TIM interface surface 310 and/or upon TIM interface surface 322 in the exemplary pattern depicted. Under pressure between chip 102 and cover 116 or under pressure between cover 116 and heatsink 104, the depicted deposition pattern may result in the high modulus TIM 220 and low modulus TIM 210 being relatively positioned as shown for example in FIG. 3A.

Figure 15:
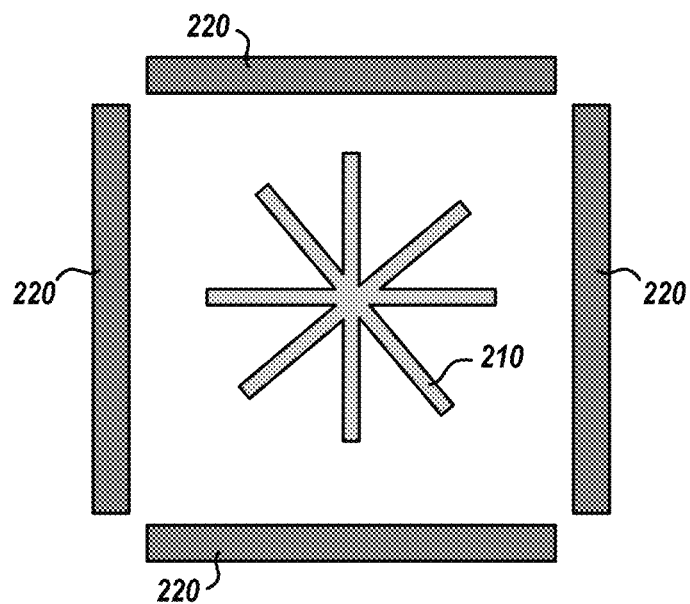

FIG. 15 depicts an exemplary deposition pattern of high modulus TIM 220 and low modulus TIM 210. High modulus TIM 220 and low modulus TIM 210 may be deposited upon TIM interface surface 310 and/or upon TIM interface surface 322 in the exemplary pattern depicted. Under pressure between chip 102 and cover 116 or under pressure between cover 116 and heatsink 104, the depicted deposition pattern may result in the high modulus TIM 220 and low modulus TIM 210 being relatively positioned as shown for example in FIG. 2A.

Figure 16:
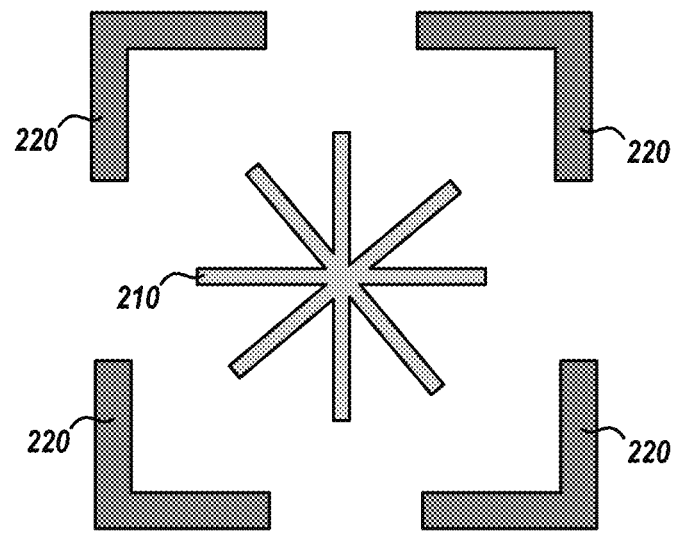

FIG. 16 depicts an exemplary deposition pattern of high modulus TIM 220 and low modulus TIM 210. High modulus TIM 220 and low modulus TIM 210 may be deposited upon TIM interface surface 310 and/or upon TIM interface surface 322 in the exemplary pattern depicted. Under pressure between chip 102 and cover 116 or under pressure between cover 116 and heatsink 104, the depicted deposition pattern may result in the high modulus TIM 220 and low modulus TIM 210 being relatively positioned as shown for example in FIG. 4A.

For clarity, FIG. 13-FIG. 16 are exemplary deposition patterns of high modulus TIM 220 and low modulus TIM 210 that may resultantly form heterogenous TIM 200 when under pressure between a higher temperature device and a lower temperature device and other patterns of high modulus TIM 220 and low modulus TIM 210 are contemplated in order to achieve such exemplary heterogenous TIM 200 structures depicted in the drawings.

Figure 17:
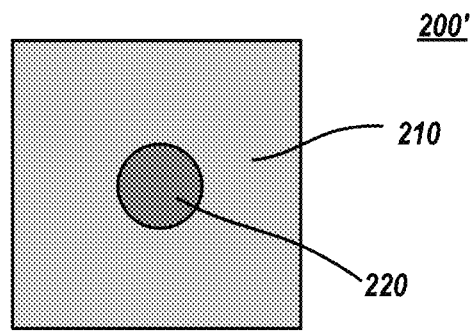
FIG. 17 depicts a normal view of a heterogenous TIM, according to one or more embodiments of the present invention.
Figure 19:
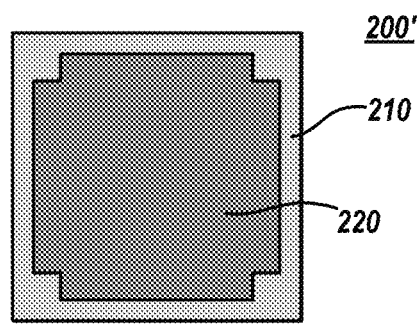
FIG. 19 depicts a normal view of a heterogenous TIM, according to one or more embodiments of the present invention.

FIG. 17 though FIG. 19 depict normal views of heterogenous TIM 200', according to one or more embodiments of the present invention.

Heterogenous TIM 200' includes a low modulus TIM 210 and a high modulus TIM 220. High modulus TIM 220 is more amenable to being deformed elastically relative to low modulus TIM 210 and better accommodates TIM strain. In the depicted embodiments, TIM strain is higher in the central region of the TIM, as opposed to those embodiments associated with heterogenous TIM 200, where TIM strain is higher in the corner and/or edge regions. Generally, the heterogenous TIM may include high modulus TIM 220 in locations where TIM strain is high and low modulus TIM 210 wherein TIM strain is relatively lower.

High modulus TIM 220 is positioned relative to low modulus TIM 210 such that high modulus TIM 220 is located in the central region of heterogenous TIM 200' and the low modulus TIM 210 is generally positioned in the corner, edge, or perimeter region(s) of TIM 200'.

For example, as shown in FIG. 17, low modulus TIM 210 is positioned exterior to high modulus TIM 220. That is, high modulus TIM 220 may be positioned entirely inside of the low modulus TIM 210 such that low modulus TIM 210 forms a perimeter of the heterogenous TIM 200'. In such embodiments, low modulus TIM 210 forms or is generally nearer to each edge or side surface of the heterogenous TIM 200' relative to the high modulus TIM 220.

Figure 18:
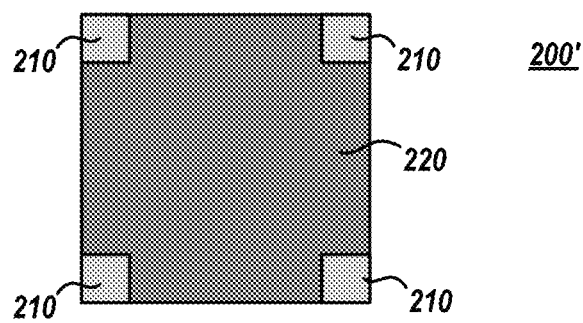
FIG. 18 depicts a normal view of a heterogenous TIM, according to one or more embodiments of the present invention.

For example, as shown FIG. 18, a low modulus TIM 210 instance forms or is generally nearer to a corner of the heterogenous TIM 200' relative to the high modulus TIM 220. The term For example, as shown in FIG. 19, low modulus TIM 210 edge portions are positioned exterior to high modulus TIM 220 and low modulus TIM 210 corner portions are positioned at each corner of heterogenous TIM 200'. In such embodiments, high modulus TIM 220 is positioned entirely inside of the low modulus TIM 210 such that low modulus TIM 210 edge portions form a perimeter of the heterogenous TIM 200' and the low modulus TIM 210 portions form or are generally nearest to each corner of the heterogenous TIM 200' relative to the high modulus TIM 220.

For clarity, the low modulus TIM 210 and the high modulus TIM 220 in any of the heterogenous TIM 200 instances depicted in the Figures, where TIM strain is higher in the corner/edge regions of the TIM, may be relatively reversed to form heterogenous TIM 200' where TIM strain is higher in the central region of the TIM.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or upper surface of carrier 108, regardless of the actual spatial orientation of the carrier 108. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. An electronic device comprising:
   a heatsink connected to an integrated circuit (IC) chip package by a heterogenous thermal interface material (TIM);
   the IC chip package comprising: a carrier comprising an IC chip connected thereto; and a lid connected to the carrier and thermally connected to an upper surface of the IC chip
   the heterogenous TIM comprising:
      one or more high modulus TIM instances each between and joining the upper surface of the lid and the heatsink, each high modulus TIM instance located nearest to a different corner of the lid; and
      a low modulus TIM between and joining the upper surface of the lid and the heatsink, the low modulus TIM located upon remaining area of the upper surface of the lid and contacts each high modulus TIM instance.

2. The electronic device of claim 1, wherein the low modulus TIM comprises an elastic modulus less than half of that of the high modulus TIM.

3. The electronic device of claim 1, wherein each high modulus TIM instance is a thermal interface material that comprises an elastic modulus an order of magnitude larger than that of the low modulus TIM.

4. The electronic device of claim 1, wherein each high modulus TIM instance comprises a first edge side surface and a second edge side surface, wherein the first edge side surface is coplanar with a first edge side surface of the lid, and wherein the second edge side surface is coplanar with a second edge side surface of the lid.

5. The electronic device of claim 4, wherein the first edge side surface is further coplanar with a first edge side surface of the low modulus TIM, and wherein the second edge side surface is further coplanar with a second edge side surface of the low modulus TIM.

6. The electronic device of claim 1, wherein the low modulus adjacently contacts each high modulus TIM instance such that polymers of the low modulus TIM are crosslinked with polymers of each of the high modulus TIM instances.

7. The electronic device of claim 1, wherein the low modulus TIM has higher thermal conductivity relative to the heat transfer coefficient of each of the high modulus TIM instances.

* * * * *